(12) United States Patent
Wagner et al.

(10) Patent No.: US 10,756,707 B1
(45) Date of Patent: Aug. 25, 2020

(54) AREA-EFFICIENT DYNAMIC CAPACITOR CIRCUIT FOR NOISE REDUCTION IN VLSI CIRCUITS

(71) Applicant: International Business Machines Corporation, Armonk, NY (US)

(72) Inventors: Israel A. Wagner, Zichron Yaakov (IL); Noam Jungmann, Tel Aviv (IL); Elazar Kachir, Haifa (IL)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/419,663

(22) Filed: May 22, 2019

(51) Int. Cl.
*H03H 11/12* (2006.01)
*H01G 4/00* (2006.01)
*H01G 4/40* (2006.01)

(52) U.S. Cl.
CPC ........... *H03H 11/1213* (2013.01); *H01G 4/00* (2013.01); *H01G 4/40* (2013.01)

(58) Field of Classification Search
CPC .............................. H03H 11/1213; H01G 4/00
See application file for complete search history.

(56) References Cited

U.S. PATENT DOCUMENTS

| | | | |
|---|---|---|---|
| 7,268,718 B1 * | 9/2007 | Wu | H03M 1/66 341/144 |
| 7,309,906 B1 | 12/2007 | Tyhach et al. | |
| 7,859,024 B2 | 12/2010 | Bosshart | |
| 8,455,979 B2 | 6/2013 | Booth, Jr. et al. | |
| 8,946,856 B2 | 2/2015 | Pereira et al. | |
| 9,722,563 B2 | 8/2017 | Kropfitsch et al. | |
| 10,141,393 B1 | 11/2018 | Ramsbey et al. | |
| 10,165,673 B2 | 12/2018 | Tsukuda | |
| 2017/0063355 A1 | 3/2017 | Thaik et al. | |

FOREIGN PATENT DOCUMENTS

CN 107579722 * 1/2018

OTHER PUBLICATIONS

Wang et al., "A Two-Terminal Active Capacitor", IEEE Transactions on Power Electronics, vol. 32, No. 8, Aug. 2017, pp. 5893-5896.
Ho et al., "A Chip-Area Efficient Capacitor-less CMOS LDO with Active Feedback and Damping Zero Compensation", 2010 53rd IEEE International Midwest Symposium on Circuits and Systems (MWSCAS), Sep. 2010, pp. 574-577.

* cited by examiner

*Primary Examiner* — Dinh T Le
(74) *Attorney, Agent, or Firm* — Scully, Scott, Murphy & Presser, P.C.; Alvin Borromeo, Esq.

(57) ABSTRACT

A dynamic capacitor circuit having a first passive capacitor, a second passive capacitor, a first terminal of the first passive capacitor and a first terminal of the second passive capacitor connected together to receive an input signal through a resistor. The input signal includes a noise signal component. An alternating current (AC) coupled inverting amplifier has an input connecting a second terminal of the second passive capacitor, the second capacitor coupling the input signal to the AC coupled inverting amplifier input. A conductive path couples an output of the AC coupled inverting amplifier to a second terminal of the first passive capacitor to balance out any noise signal component of the input AC signal at the connection. The dynamic capacitor achieves an amount of noise reduction in a reduced space without applying deep trench capacitors (DTCAP) where the DTCAP is a capacitance formed in a plane perpendicular to the substrate.

20 Claims, 7 Drawing Sheets

US 10,756,707 B1

AREA-EFFICIENT DYNAMIC CAPACITOR CIRCUIT FOR NOISE REDUCTION IN VLSI CIRCUITS

FIELD

The present application relates to capacitor elements in integrated circuits for use in reducing noise on direct current (DC) voltage lines and, in particular, to a circuit that enhances the capacitance of a passive capacitor by an alternating current (AC) coupled inverting amplifier in order to achieve a large capacitance in a small area.

BACKGROUND

Large capacitors are frequently needed in Very Large-Scale Integrated (VLSI) circuits, particularly for: 1) Reducing noise on DC lines; and 2) Creating efficient filters. In the past, DT (Deep-Trench) capacitors were used for large-capacitor, small-area needs, but in today's products these caps are not always used to reduce cost.

Hence, there is a need in large capacitors within small area without the more expensive DT process.

SUMMARY

In one aspect there is provided a circuit that enhances the capacitance of a passive capacitor by an AC-coupled inverting amplifier, in order to achieve large capacitance in a small area.

In one embodiment, the AC noise is filtered-out using a relatively small capacitor by means of a dynamic filter embodied as an inverting amplifier.

Advantages over existing methods is that the proposed circuit and method is simpler, requires a much smaller area, and does not rely on expensive semiconductor fabrication process (e.g., such as Deep-Trench manufacturing processes).

In accordance with a first aspect of the invention, there is provided a dynamic capacitor circuit. The dynamic capacitor circuit comprises: a first passive capacitor; a second passive capacitor, a first terminal of the first passive capacitor and a first terminal of the second passive capacitor connected together to receive an input signal through a resistor, the input signal having a noise signal component; an alternative current (AC) coupled inverting amplifier having an input connecting a second terminal of the second passive capacitor, the second capacitor coupling the input signal to the AC coupled inverting amplifier input; and a conductive path coupling an output of the AC coupled inverting amplifier to a second terminal of the first passive capacitor to balance out any noise signal component of the input AC signal at the connection.

In accordance with a further aspect of the invention, there is provided a method of operating a dynamic capacitor. The method comprises: receiving at a connection comprising a first terminal of a first passive capacitor and a first terminal of a second passive capacitor, the input signal having a noise signal component; coupling, through the second capacitor, the in input signal to an input of an alternating current (AC) coupled inverting amplifier; coupling, via a conductive path, an output signal at an output of the AC coupled inverting amplifier to a second terminal of the second passive capacitor to result in balancing out the noise signal component of the input signal at the connection.

DETAILED DESCRIPTION

Figure 1:
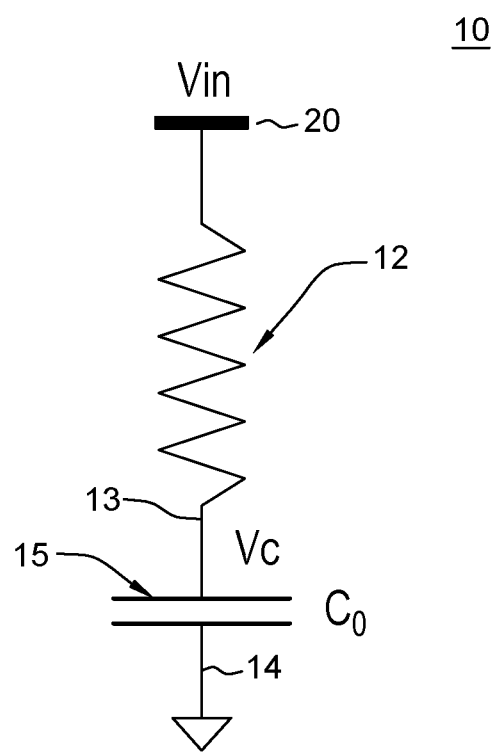
FIG. 1 is a prior art circuit schematic depicting a deep trench capacitor for noise reduction in an integrated circuit.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIG. 1 is a prior art circuit schematic depicting a capacitor 10 for noise reduction in an integrated circuit. As shown in FIG. 1, the capacitive circuit 10 is passive as it includes no active components but a capacitor element 15 of capacity value $C_0$ having a first end or terminal connected to one end 13 of a resistive element, e.g., resistor 12, and the other end or terminal connected to a ground potential 14. The voltage output of the capacitor is indicated as Vc. The resistor element 12 has another end connected to a voltage line 20, e.g., Vin that supplies a voltage to further circuit elements (not shown). The capacitor element 15 provides a passive conductive path to the ground 14 for noise signals present on Vin line 20. It is noted in the prior art embodiment of FIG. 1 that the total capacitance is a capacitance value of: $C_0$. In an embodiment, a value of capacitor $C_0$ can be 75 femto-Farads (fF).

Figure 2A:
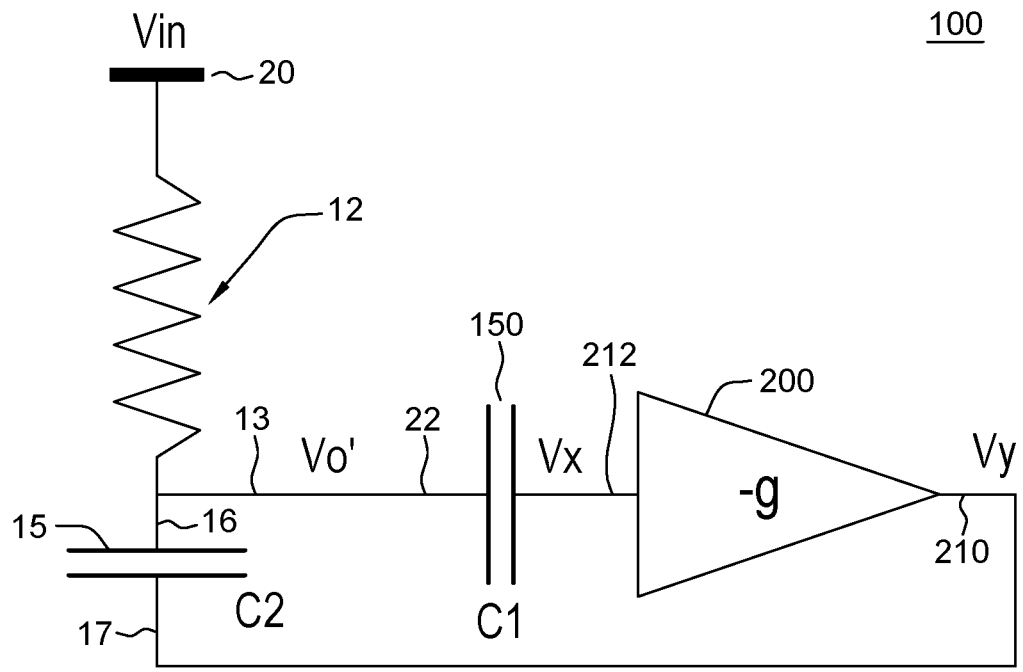
FIG. 2A is a circuit schematic depicting a dynamic capacitor implementing an inverting amplifier for noise reduction in an integrated circuit according to a first embodiment of the invention.

FIG. 2A is a circuit schematic depicting a dynamic capacitor 100 implementing an inverting amplifier for noise reduction in integrated circuits such as VLSI circuits according to a first embodiment of the invention. As shown in FIG.

2A, the dynamic capacitor 100 includes the resistor element 12 connected to the first terminal 16 of passive capacitor element 15 of a capacity value $C_2$ as shown in FIG. 1. In the embodiment of FIG. 2A, however, there is no connection to the ground potential as in the embodiment of FIG. 1. The resistor element 12 is further connected at an end 13 to a first terminal 22 of a second passive capacitor element 150 of a capacity value $C_1$. As shown in FIG. 2A, the dynamic capacitor 100 is active in that the second end or terminal 212 of second passive capacitor 150 is connected as input to an alternating current (AC) coupled inverting amplifier 200. The output 210 of the amplifier 200 is connected to the second terminal 17 of the passive capacitor element 15. In an embodiment, the AC coupled inverting amplifier 200 is configured to provide an amplifier gain of "−g" which is the inverting amplifier's transconductance value. It is noted that a total capacitance presented by the dynamic capacitor 100 is: C1+C2 where, with active inverting amplifier component 200, a device area of C1+C2 is much smaller than C0, however is still able achieve the same amount of noise-reduction as in the prior art device.

In an embodiment, voltage Vin can include a direct current (DC) voltage signal which is blocked by the action of first and second passive capacitors 15 and 150. Any noise signal component present in input voltage Vin however is conducted through the resistor 12 and shown as a voltage signal Vo' at the connection 13 of the first terminal 16 of passive capacitor 15 and first terminal 22 of the second passive capacitor 150. The noise component signal Vo' is conducted through second capacitor 150 and is shown as resulting signal Vx provided as the input 212 to the AC-coupled dynamic inverting amplifier 200. The output signal Vy of the dynamic inverting amplifier is provided as a negative feedback signal and conducted along a conductive path 210 to the second capacitor terminal 17 of passive capacitor 15. Passive capacitor 15 couples the feedback signal to balance out the noise signal component Vo' at the connection 13.

Figure 2B:
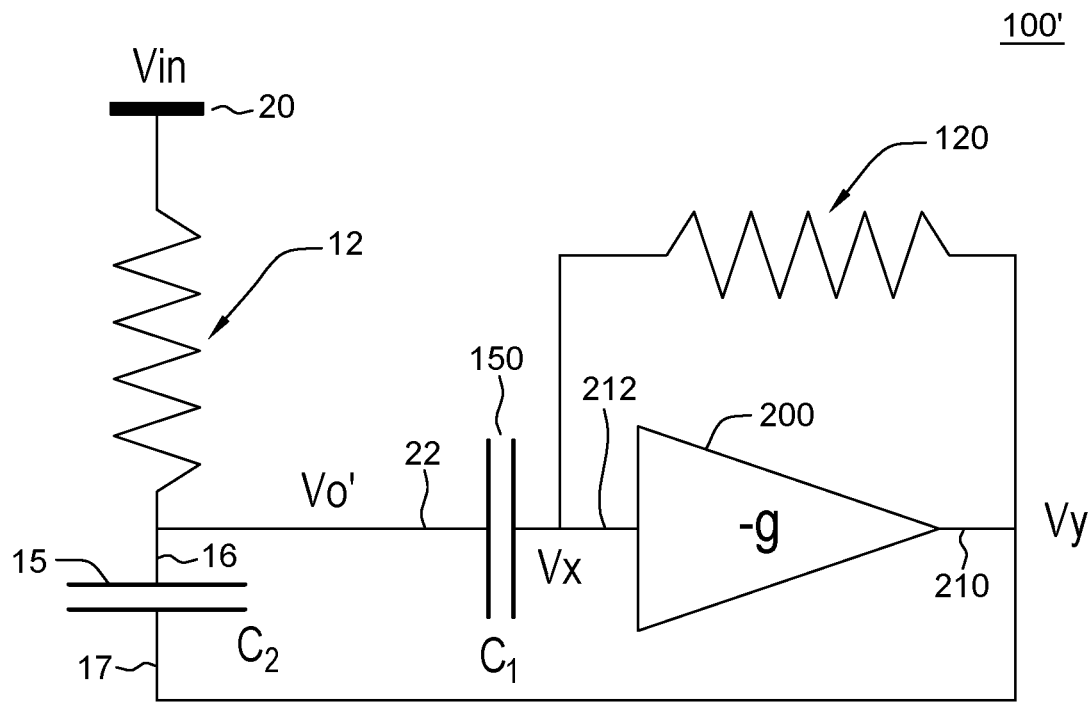
FIG. 2B is a circuit schematic depicting a dynamic capacitor implementing an inverting amplifier for noise reduction in an integrated circuit according to an alternative embodiment of the invention.

In an alternative embodiment, FIG. 2B depicts a dynamic capacitor 100' that is identical to the dynamic capacitor 100 of FIG. 2A, however further including a second resistor element 120 used as a further resistive feedback path connecting the inverting amplifier output signal Vy at 210 back to the input of the inverting amplifier 200 at input terminal 212. The additional feedback resistor 120 is effective in stabilizing the bias of amplifier 200.

FIGS. 2A, 2B further depict the feedback behavior of the dynamic capacitor circuits in which the total capacitance is dynamically increased in the manner as expressed in the following sequence of events, wherein a voltage of the events comprises:

$$Vin+ \rightarrow Vo'+ \rightarrow Vx+ \rightarrow Vy- \rightarrow Vo-$$

where: Vin is the input voltage to the resistor 12, Vo' is the voltage including noise component signal at the connection 13 after said resistor, Vx is an input to the AC coupled inverting amplifier 200, Vy is the inverting amplifier's output signal, and Vo− is the stabilized and balanced noise signal component at connection 13 resulting from the conducting of inverting amplifier output signal Vy along feedback path 210 through passive capacitor 15.

Figure 3:
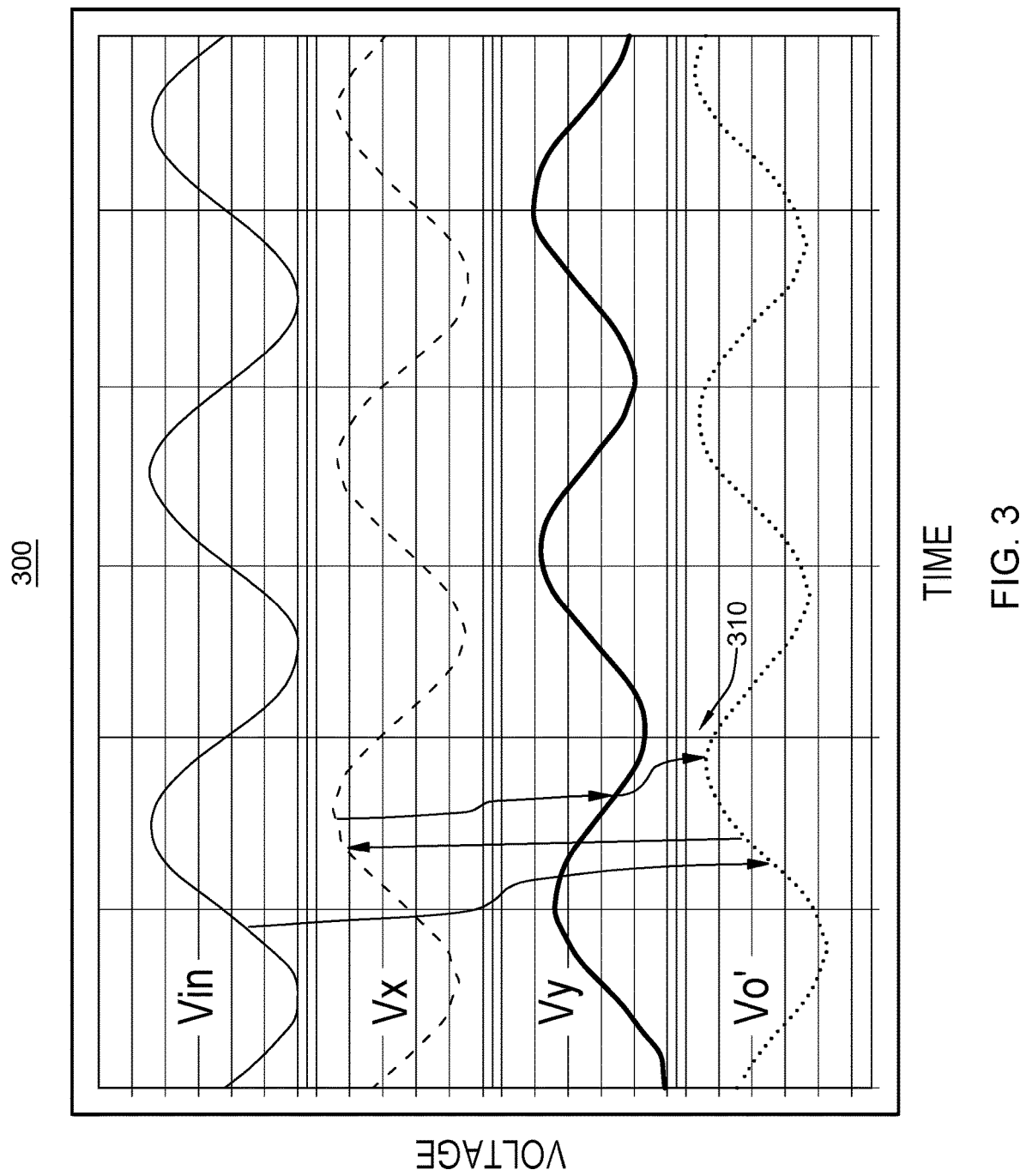
FIG. 3 is a timing diagram depicting example voltage waveforms of signals Vin, Vo', Vx and Vy versus time as shown in the dynamic capacitor of FIGS. 2A, 2B.

FIG. 3 is a timing diagram 300 depicting example voltage waveforms of signals Vin, Vo', Vx and Vy shown in the dynamic capacitor 100/100' of FIGS. 2A, 2B versus time. As depicted at 310, the amplitude of signal Vo' at connection 13 is suppressed (e.g., decreased) by the coupling of Vy via the passive capacitor C2. In the dynamic capacitor embodiments 100/100' of FIGS. 2A, 2B, the sequence of events is such that the Vo' signal is stabilized and balanced via feedback to result in the stabilized and balanced noise signal component Vo−.

Figure 4:
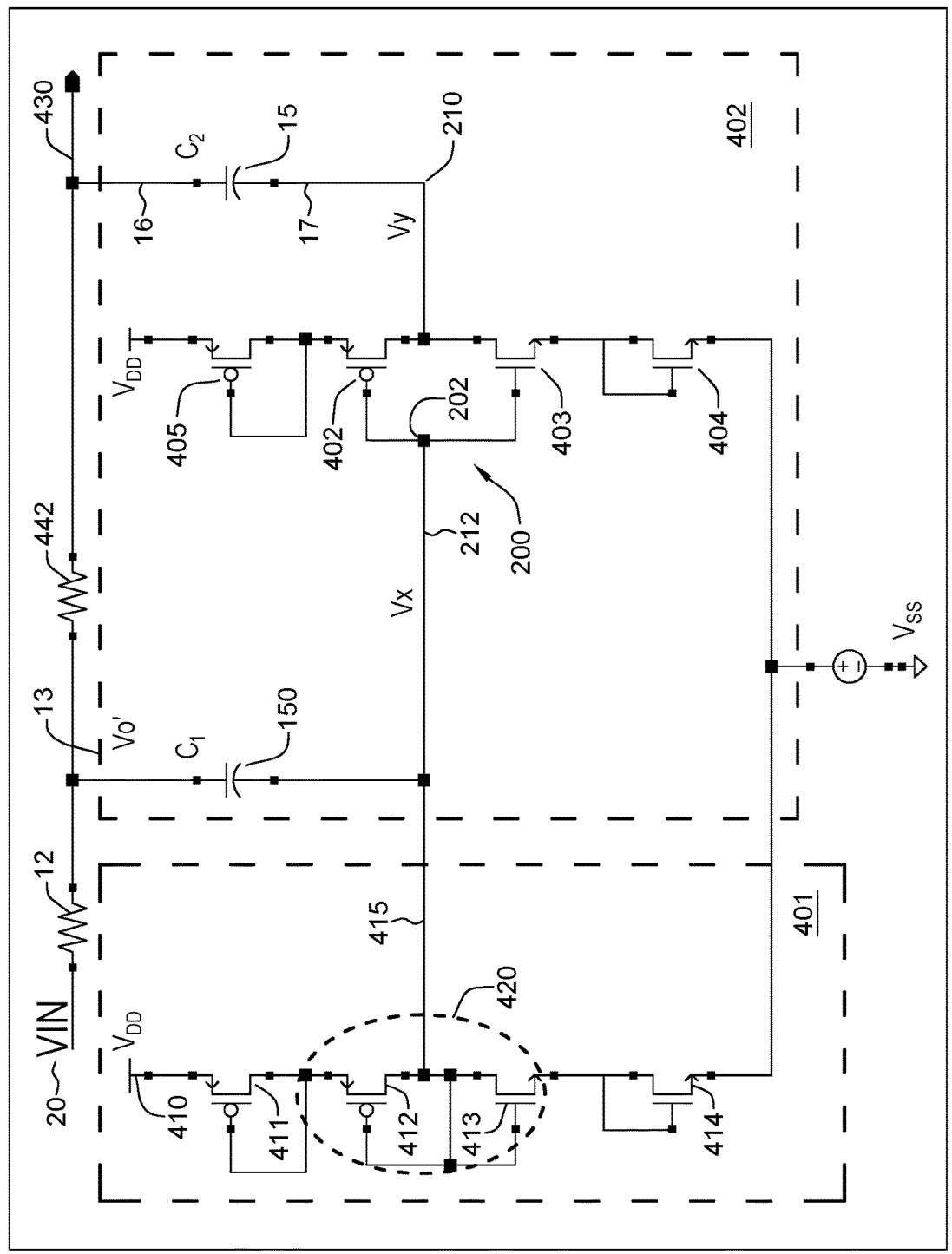
FIG. 4 shows a more detailed circuit schematic of the area-efficient dynamic active capacitor circuit of FIG. 2A.

FIG. 4 shows a more detailed circuit schematic of an area-efficient dynamic active capacitor circuit 400 corresponding to circuit 100 of FIG. 2A. In the area-efficient dynamic active capacitor circuit 400 of FIG. 4, the AC coupled inverting amplifier includes a bias circuit 401 to provide bias voltage signal 415 to the active dynamic capacitor circuit inverting amplifier portion 402 providing a dynamic capacitor output terminal 430. Each of the components in circuits 401, 402 are manufactured on an integrated circuit chip (i.e., on-chip), using conventional Complementary Metal Oxide Semiconductor (CMOS) semiconductor manufacturing techniques.

In FIG. 4, the bias circuit 401 includes a Vdd voltage supply source 410 and a voltage divider circuit 420 that provides a bias voltage input 415 to the AC coupled inverting amplifier 200 of dynamic capacitor circuit portion 402. As shown in FIG. 4, in bias circuit 401, a $V_{DD}$ voltage supply source 410 provides a DC bias voltage through a path of series connected metal-oxide semiconductor field effect transistor devices, e.g., MOSFET devices 411, 412, 413, 414. These MOSFET devices 411, 412, 413, 414 is made of P-type and N-type MOSFETs in order to compensate for Strong P/Weak N or Weak P/Strong N variations. In an embodiment, MOSFET devices 411, 412, 413, 414 provide a divider output voltage 415 results from a voltage divider circuitry 420 comprising connected transistors 412, 413 in the bias voltage signal path. The divided down DC bias voltage 415 is applied on a conductive path 212 for input to the (AC coupled) inverting amplifier of dynamic capacitor circuit portion 402. In embodiments, the voltage divider circuit 420 can be shared with several other instances of the dynamic capacitor, thus saving area and power. This path further connects to a second terminal end of the first passive capacitor ($C_1$) 150 shown in the dynamic active capacitor circuit 402 which couples noise components of the Vo' signal to the input 202 of the inverting amplifier 200. As shown, bias voltage 415 is simultaneously applied directly to gates of both PMOS FET 402 and NMOS FET 403 comprising the input 202 of the inverting amplifier 200.

As further shown in FIG. 4, inverting amplifier 200 further includes a high voltage supply signal VDD feeding bias voltages to further PMOS FET 405 connected in series with a drain terminal of PMOS FET 402. Similarly, inverting amplifier further includes a low supply (i.e., ground potential) VSS connecting further NMOS FET 404 connected in series with NMOS FET 403. As shown in FIG. 4, PMOS FET 405 and NMOS FET 404 each include a shorted gate-drain terminals rendering these FETs each in saturation and always in full conduction.

In the dynamic capacitor circuit portion 402, the Vin voltage 20 is coupled via the resistor 12 to result in voltage Vo' having noise signal components at connection 13 connecting first terminals of the respective passive capacitors $C_1$ 150 and $C_2$ 15. Capacitor $C_2$ 15 is connected via wire resistance 442. As further shown in FIG. 4, this Vo' voltage at connection 13 of capacitors 15 and 150 is coupled to the input gates of MOSFET transistors 402, 403 of AC coupled inverting amplifier as voltage Vx. The AC coupled inverting amplifier 200 responsively generates an output voltage Vy which is coupled through feedback path 210 to the second terminal 17 of second passive capacitor 15 in the manner as discussed with respect to FIG. 2A. In the embodiment depicted in FIG. 4, a resistor element 442 is shown having one end connecting the first terminal of passive capacitor $C_2$ 15 and having another end connecting to the first terminal of passive capacitor $C_1$ 150.

In embodiments, passive capacitors $C_1$ 150 and $C_2$ 15 are fin-capacitors fabricated according to CMOS 7 nm node technology. Moreover, the resistor elements 12, 442 can be tuned to optimize power/delay. In an embodiment, both $C_1$ 150 and $C_2$ 15 in the dynamic capacitor circuit 400 provide a total capacitance of 30 fF.

In an embodiment, the inverting amplifier 200 is AC-coupled, i.e., provides capacitance for removing AC signals or noise from the voltage line 20 carrying voltage signal Vin. The dynamic capacitor circuits of FIGS. 2A and 4 are configured to enhance the capacitance of the passive capacitor 15 by the AC-coupled inverting amplifier 200, in order to achieve large capacitance in a small area. In this manner, the AC noise can be filtered out using a relatively small capacitor by means of a dynamic filter.

Figure 5:
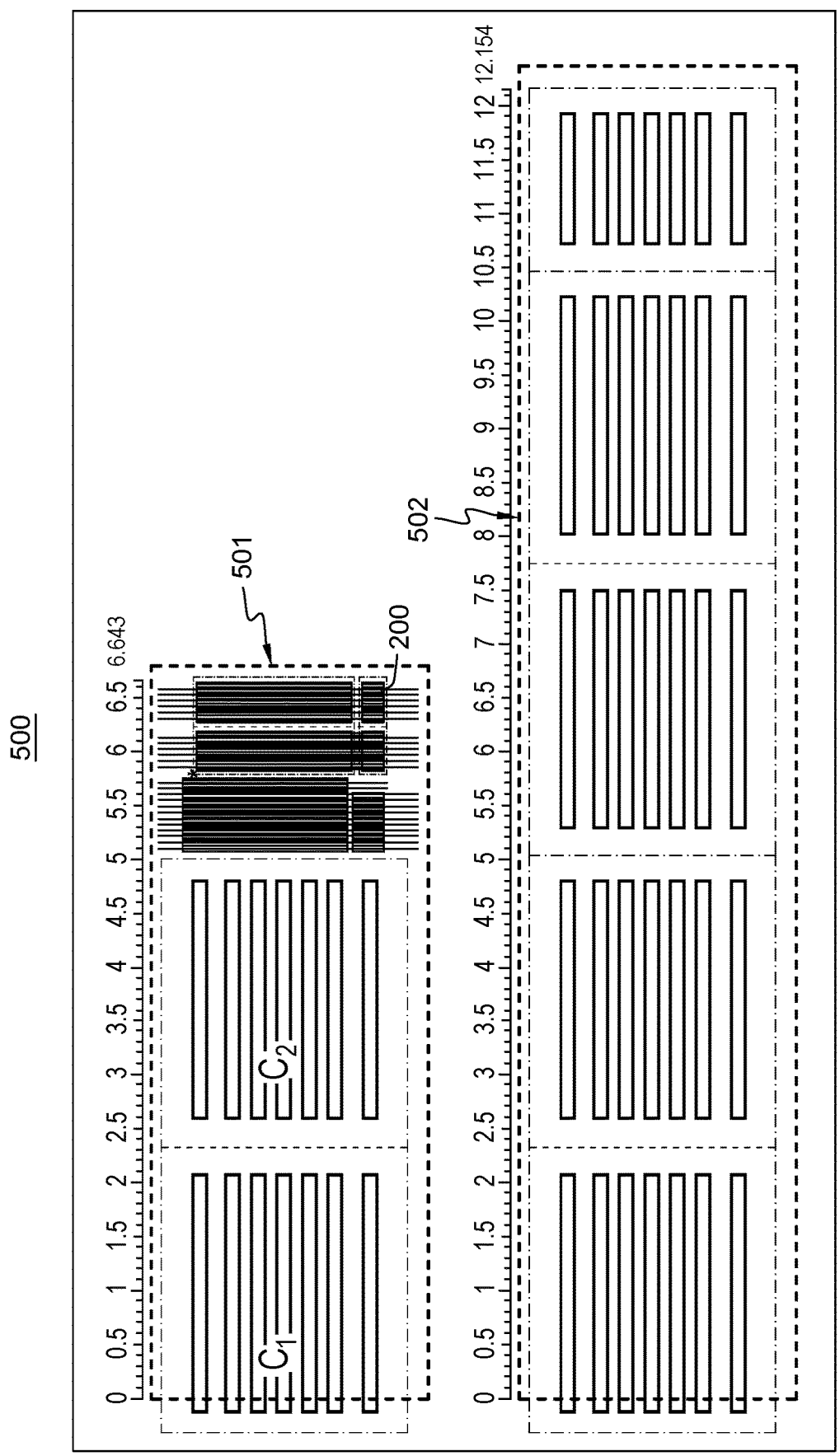
FIG. 5 shows a comparison of the integrated circuit area and layout of the dynamic capacitor circuit of FIG. 4 used for on-chip dynamic noise filtering versus the layout of a prior art static passive capacitor used for on-chip noise reduction such as shown in FIG. 1.

FIG. 5 shows a comparison 500 of the integrated circuit area and layout 501 of the dynamic capacitor circuit 400 of FIG. 4 having capacitors C1, C2 and inverting amplifier used for on-chip dynamic noise filtering versus the layout 502 of a static passive capacitor used for on-chip noise reduction such as shown in FIG. 1. In the comparison depicted, the area 502 of a static passive capacitor includes a parallel connection of several passive capacitors providing a total capacitance of 75 fF. However, to achieve the same capacitance and equivalent noise reduction filtering capability, the area 501 of the dynamic capacitor circuit 400 of FIG. 4 includes the two passive capacitors C1, C2 providing a (passive) capacitance of 30 fF total and includes the inverting amplifier 200 and bias circuit with area 501 considerably smaller than the area 502 of the prior art static passive capacitor.

In an example implementation, the dynamic capacitor circuit area 501 requires 6.6×0.246=1.6236 µm² of integrated circuit area while the static capacitor circuit area 502 requires 12.2×0.246=3.0012 µm² of integrated circuit area to achieve about the same reduction in noise amplitude. In this embodiment depicted, it is the case that the power consumption of the active dynamic capacitor circuit, averaged across a cycle, is about 2.5 pW (picowatts). Thus, in essence, to achieve the same amount of noise reduction, the dynamic capacitor circuit in layout 501 obtains approximately an additional 45 fF, at a cost of 2.5 pW in power, however using about 54% of the area of the static capacitor.

That is, in the example depicted in FIG. 5, there is obtained about the same active filtering capability with capacitors providing of 30 fF, compared to filtering obtained for a passive cap of 75 fF. Power consumption can be made lower by using a single bias circuit for several dynamic capacitors.

In an example use case, for a typical capacitive array that requires a 7.5 pF decoupling capacitors, 100 such dynamic capacitors with active filtering would be needed however, consuming about 0.25 mW power, as compared to the equivalent static capacitor case which would consume to about 7.5 mw (about 10%) array power consumption.

Figure 6:
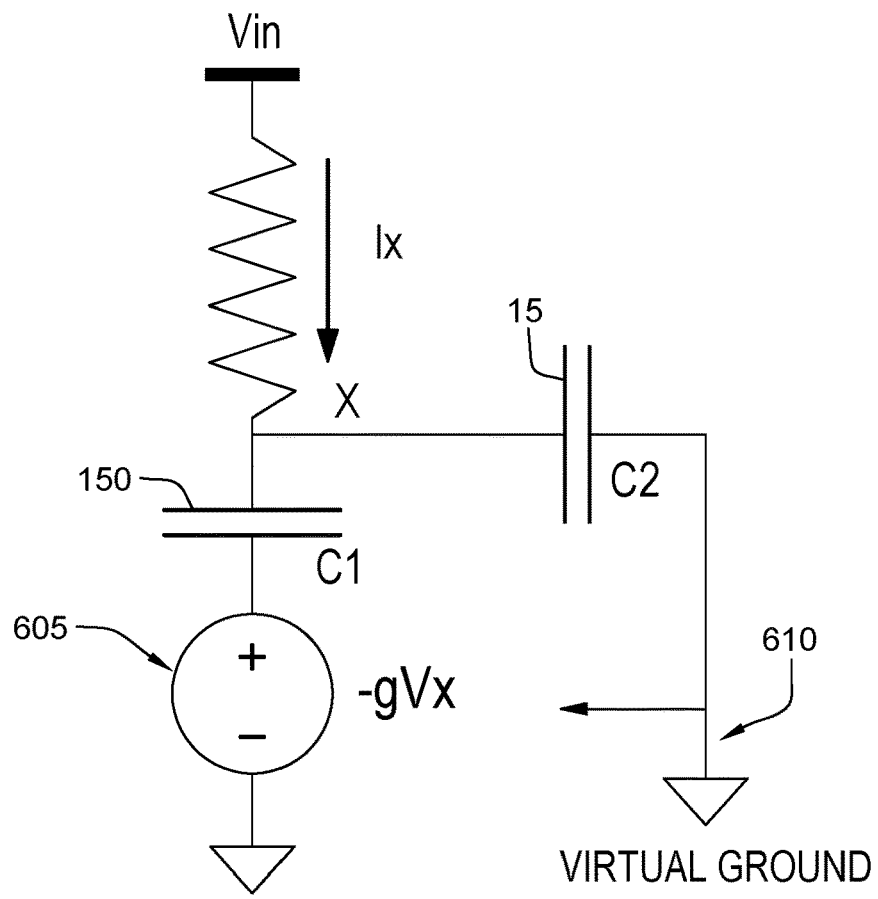
FIG. 6 shows an equivalent circuit model corresponding to the circuits of FIG. 2A and FIG. 2B used for computing the input impedance Zin seen at a node "X" as depicted.

FIG. 6 shows an equivalent circuit model 600 corresponding to the circuit 100 of FIG. 2A and particularly, the input impedance Zin seen at a node "X" corresponding to the connection 13 of the capacitor terminals of passive capacitors $C_1$ 150 and $C_2$ 15 depicted. In FIG. 6, the equivalent circuit model 605 of the inverting amplifier dynamic filter provides a negative gain of −g where "g" is the transconductance of the inverting amplifier. The path connecting the output of the inverting amplifier to the passive feedback capacitor terminal of C2 is shown as a virtual ground or common 610. Impedance Zin as the impedance seen at node 13 as computed according to:

$$Z_{in} = \frac{V_x}{I_x} = \frac{V_x}{I_{C1} + I_{C2}} = Z_{in} = V_x / \left[ \frac{V_x + gV_x}{1/sC1} + \frac{V_x}{1/sC2} \right] = 1/(sC1(1+g) + sC2)$$

Figure 7:
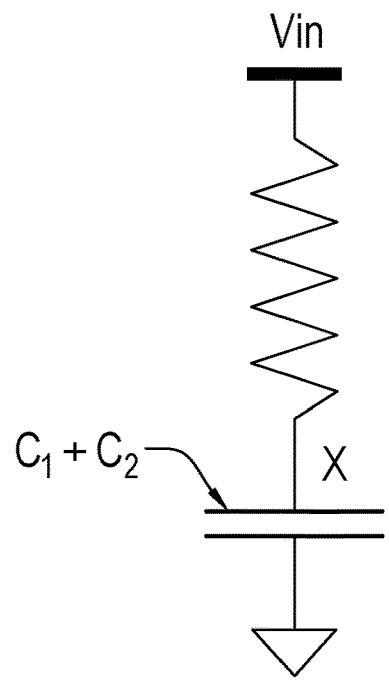
FIG. 7 shows an equivalent circuit model corresponding to the prior art circuit of FIG. 1 used for computing the input impedance Zin seen at a node "X" as depicted.

Compared to the prior art passive capacitor-only circuit of FIG. 7, an equivalent input impedance seen at node X assuming the equivalent passive capacitors $C_1+C_2$, is computed according to:

$$Zin = 1/s(C1+C2)$$

Figure 8:
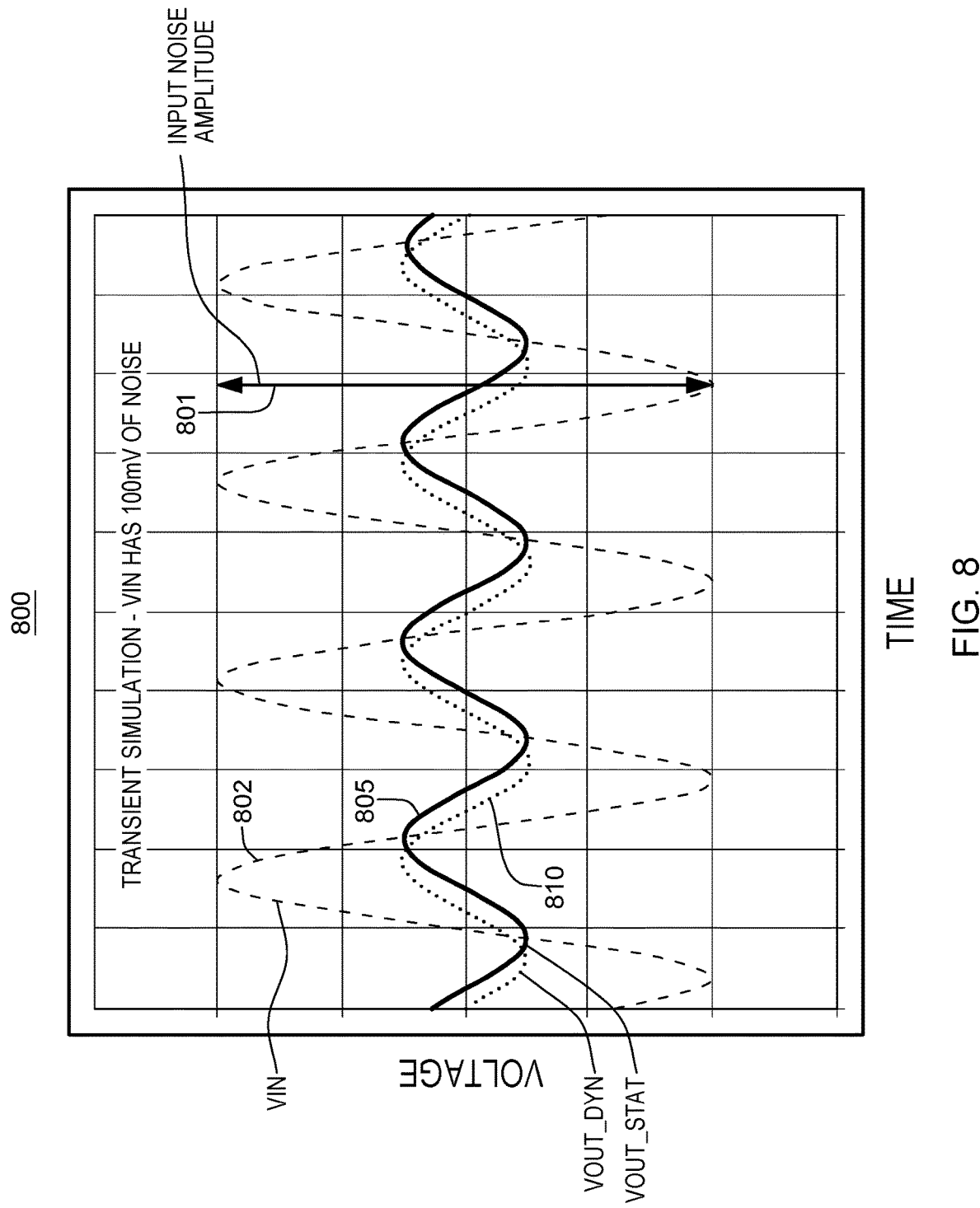
FIG. 8 depicts a further waveform timing diagram 800 showing a simulation of transient signal responses in both prior art and the dynamic capacitor noise reduction circuits.

FIG. 8 depicts a further waveform timing diagram 800 showing a simulation of transient signal responses in both prior art and the dynamic capacitor noise reduction circuits. FIG. 8 particularly shows a comparison of the output signal noise amplitudes in the embodiment using noise reduction passive capacitor of 75 fF according to the prior art, as compared to signal noise amplitudes using noise reduction active (dynamic) capacitor of the 30 fF capacitors. As shown, given a transient noisy $V_{IN}$ signal 802 (e.g., DC signal+sinewave) providing a large peak-to-peak noise amplitude 801, two responses are shown. One response 805 depicts the reduction in noise (e.g., sinewave) at the static (prior art) passive capacitor circuit output as compared to the response 810 depicting the reduction in noise using the dynamic capacitor circuit output. As shown in FIG. 8, the dynamic capacitor circuit output is shown providing about the same reduction in noise amplitude, compared to static (prior art) capacitor.

The area-efficient dynamic active capacitor circuit 100 of FIG. 2A and 100' of FIG. 2B can be integrated as a part of a memory array or any other circuit that requires large capacitance in a small area.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A dynamic capacitor circuit comprising:
   a first passive capacitor;
   a second passive capacitor, a first terminal of said first passive capacitor and a first terminal of said second passive capacitor connected together to receive an input signal through a resistor, said input signal having a noise signal component;
   an alternating current (AC) coupled inverting amplifier having an input connecting a second terminal of said second passive capacitor, the second capacitor coupling said input signal to said AC coupled inverting amplifier input;
   a conductive path coupling an output of said AC coupled inverting amplifier to a second terminal of said first passive capacitor to balance out any noise signal component of said input AC signal at the connection of said first terminal of said first passive capacitor and said first terminal of said second passive capacitor, said dynamic capacitor circuit integrated in a semiconductor integrated circuit (IC) to provide a capacitance value, the dynamic capacitor circuit taking up a physical area of the semiconductor IC that is reduced in size when compared to an area in the integrated circuit of a static capacitor circuit comprised of only passive capacitors when providing a same said capacitance value.

2. The dynamic capacitor circuit of claim 1, providing a total capacitance comprising a capacitance of first passive capacitor added to the capacitance of a second passive capacitor.

3. The dynamic capacitor circuit of claim 1, wherein said AC coupled inverting amplifier is a dynamic filter for filtering out a noise signal component.

4. The dynamic capacitor circuit of claim 3, wherein the conductive path provides a negative feedback signal through said second passive capacitor to decrease an amplitude of an output signal of the AC inverting amplifier output resulting in balancing out the noise signal component at the connection of said first terminals of said first passive capacitor and second passive capacitors.

5. The dynamic capacitor circuit of claim 4, wherein, the conductive path provides a negative feedback signal through said second passive capacitor to stabilize a voltage at the connection of said first terminals of said first passive capacitor and second passive capacitors.

6. The dynamic capacitor circuit of claim 5, wherein a negative feedback behavior of the dynamic capacitor circuit comprises:
receiving Vin as said input voltage to the resistor, obtaining a Vo' voltage at said connection after said resistor, obtaining a Vx voltage input to said AC coupled inverting amplifier, obtaining a Vy voltage as said inverting amplifier's output signal, and obtaining a Vo− negative feedback signal to balance said noise signal component present in said Vo' voltage.

7. The dynamic capacitor circuit of claim 1, wherein said dynamic capacitor circuit does not comprise deep-trench capacitors and avoids using a deep-trench capacitor fabrication process.

8. A method of operating a dynamic capacitor circuit comprising:
receiving at a connection comprising a first terminal of a first passive capacitor and a first terminal of a second passive capacitor, said input signal having a noise signal component;
coupling, through said second capacitor, said in input signal to an input of an alternating current (AC) coupled inverting amplifier;
coupling, via a conductive path, an output signal at an output of said AC coupled inverting amplifier to a second terminal of said second passive capacitor to result in balancing out the noise signal component of said input signal at the connection of said first terminal of said first passive capacitor and said first terminal of said second passive capacitor,
wherein said dynamic capacitor circuit is integrated in a semiconductor integrated circuit (IC) to provide a capacitance value, the dynamic capacitor circuit taking up a physical area of the semiconductor IC that is reduced in size when compared to an area in the integrated circuit of a static capacitor circuit comprised of only passive capacitors when providing a same said capacitance value.

9. The method of claim 8, wherein said capacitance value comprises a capacitance of first passive capacitor added to the capacitance of a second passive capacitor.

10. The method of claim 8, wherein said dynamic capacitor circuit is configured to cancel out a noise signal component: using said AC coupled inverting amplifier as a dynamic filter for filtering out said noise signal component.

11. The method of claim 10, wherein said canceling out the noise signal component comprises: providing, via the conductive path, a negative feedback signal through said second passive capacitor to decrease an amplitude of an output signal of the AC inverting amplifier output and for balancing the noise signal component at the connection of said first terminals of said first passive capacitor and second passive capacitor.

12. The method of claim 10, wherein said canceling out the noise signal component comprises: providing, via the conductive path, a negative feedback signal through said second passive capacitor to stabilize a voltage at the connection of said first terminals of said first passive capacitor and second passive capacitor.

13. The method of claim 12, wherein a negative feedback behavior of the dynamic capacitor circuit comprises:
receiving Vin as said input voltage to the resistor, obtaining a Vo' voltage at said connection after said resistor, obtaining a Vx voltage input to said AC coupled inverting amplifier, obtaining a Vy voltage as said inverting amplifier's output signal, and obtaining a Vo− negative feedback signal to balance said noise signal component present in said Vo' voltage.

14. The method of claim 8, wherein said dynamic capacitor circuit does not comprise deep-trench capacitors and avoids using a deep-trench capacitor fabrication process.

15. A system for reducing noise in a power network providing direct current (DC) signals in an integrated circuit, the system comprising:
a dynamic capacitor circuit comprising:
a first passive capacitor;
a second passive capacitor, a first terminal of said first passive capacitor and a first terminal of said second passive capacitor connected together to receive an input DC signal through a resistor, said DC input signal having a noise signal component;
an alternating current (AC) coupled inverting amplifier having an input connecting a second terminal of said second passive capacitor, the second capacitor coupling said input signal to said AC coupled inverting amplifier input; and
a conductive path coupling an output of said AC coupled inverting amplifier to a second terminal of said first passive capacitor to balance out any noise signal component of said input AC signal at the connection of said first terminal of said first passive capacitor and said first terminal of said second passive capacitor,
said dynamic capacitor circuit integrated in a semiconductor integrated circuit (IC) and coupled to a circuit of the power network at the first terminal of said first passive capacitor to provide a capacitance value to achieve an amount of signal noise reduction, the dynamic capacitor circuit taking up a physical area of the semiconductor IC that is reduced in size when compared to an area in the integrated circuit of a static capacitor circuit comprised of only passive capacitors when providing a same amount of said signal noise reduction.

16. The system of claim 15, wherein said AC coupled inverting amplifier is a dynamic filter for filtering out said noise signal component.

17. The system of claim 16, wherein the conductive path provides a negative feedback signal through said second passive capacitor to decrease an amplitude of an output signal of the AC inverting amplifier output resulting in balancing out the noise signal component at the connection of said first terminals of said first passive capacitor and second passive capacitor.

18. The system of claim 16, wherein, the conductive path provides a negative feedback signal through said second passive capacitor to stabilize a voltage at the connection of said first terminals of said first passive capacitor and second passive capacitor.

19. The system of claim 18, wherein a negative feedback behavior of the dynamic capacitor circuit comprises:
receiving Vin as said input voltage to the resistor, obtaining a Vo' voltage at said connection after said resistor, obtaining a Vx voltage input to said AC coupled inverting amplifier, obtaining a Vy voltage as said inverting amplifier's output signal, and obtaining a Vo– negative feedback signal to balance said noise signal component present in said Vo' voltage.

20. The system of claim 15, wherein said dynamic capacitor circuit does not comprise deep-trench capacitors and avoids using a deep-trench capacitor fabrication process.

\* \* \* \* \*